(12) United States Patent
Ellenson et al.

(10) Patent No.: US 7,277,619 B2
(45) Date of Patent: Oct. 2, 2007

(54) NANO-IMPRINTED PHOTONIC CRYSTAL WAVEGUIDE

(75) Inventors: James E. Ellenson, Corvallis, OR (US); Timothy S. Hostetler, Corvallis, OR (US); William M. Tong, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 348 days.

(21) Appl. No.: 11/072,657

(22) Filed: Mar. 4, 2005

(65) Prior Publication Data

US 2006/0197243 A1 Sep. 7, 2006

(51) Int. Cl.
*G02B 6/10* (2006.01)
*G11B 11/00* (2006.01)
*H01L 21/00* (2006.01)
*C03B 37/00* (2006.01)
*B29D 7/01* (2006.01)

(52) U.S. Cl. .................. 385/129; 385/14; 385/130; 385/131; 369/13.35; 369/13.38; 369/112.01; 369/112.02; 438/29; 438/31; 65/385; 65/386; 65/402; 65/404; 264/1.34; 264/1.24

(58) Field of Classification Search ............ 385/14, 385/129, 131, 132, 141; 369/13.35, 13.38, 369/112.01, 112.02, 13.24; 438/29, 31, 32, 438/26; 430/272.1, 275.1; 264/1.31, 1.34, 264/1.24, 135, 319; 522/6; 65/385, 386, 65/402, 404

See application file for complete search history.

(56) References Cited

U.S. PATENT DOCUMENTS

| | | | |
|---|---|---|---|
| 5,772,905 A | 6/1998 | Chou | 216/44 |
| 6,168,845 B1 | 1/2001 | Fontana, Jr. et al. | 428/65.5 |
| 6,334,960 B1 | 1/2002 | Willson et al. | 216/52 |
| 6,375,870 B1 | 4/2002 | Visovsky et al. | 264/1.31 |
| 6,656,398 B2 | 12/2003 | Birch et al. | 264/85 |
| 6,696,220 B2 | 2/2004 | Bailey et al. | 430/272.1 |
| 7,195,733 B2 * | 3/2007 | Rogers et al. | 264/496 |
| 2004/0110856 A1 | 6/2004 | Young et al. | 522/6 |
| 2004/0141163 A1 | 7/2004 | Bailey et al. | 355/18 |

(Continued)

*Primary Examiner*—Brian M. Healy
(74) *Attorney, Agent, or Firm*—James R. McDaniel

(57) ABSTRACT

This invention relates to a method for forming a nano-imprinted photonic crystal waveguide, comprising the steps of: preparing an optical film on a substrate; preparing a template having a plurality of protrusions of less than 500 nm in length such that the protrusions are spaced a predetermined distance from each other; heating the film; causing the template to press against the heated film such that a portion of the film is deformed by the protrusions; separating the template from the film; and etching the film to remove a residual layer of the film to form a nano-imprinted photonic crystal waveguide. Another embodiment of this invention fulfills these needs by providing a method for forming a nano-imprinted photonic crystal waveguide, comprising the steps of: a method for forming a nano-imprinted photonic crystal waveguide, comprising the steps of: preparing an optical film upon a substrate; preparing a template having a plurality of protrusions of less than 500 nm in length such that the protrusions are spaced a predetermined distance from each other; causing the template to modify a shape of the film; applying a UV light to the film and the template such that the film becomes polymerized; separating the template from the film; and etching the film to remove a residual layer of the film to form a nano-imprinted photonic crystal waveguide.

80 Claims, 10 Drawing Sheets

U.S. PATENT DOCUMENTS

2006/0137601 A1* 6/2006 Miguez et al. ................ 117/35
2006/0197243 A1* 9/2006 Ellenson et al. ........... 264/1.24
2006/0286488 A1* 12/2006 Rogers et al. .............. 430/325

* cited by examiner

NANO-IMPRINTED PHOTONIC CRYSTAL WAVEGUIDE

BACKGROUND OF THE INVENTION

1. Field of the Invention

This invention relates to a method for forming a nano-imprinted photonic crystal waveguide, comprising the steps of: preparing an optical film on a substrate; preparing a template having a plurality of protrusions of less than 500 nm in length such that the protrusions are spaced a predetermined distance from each other; heating the film; causing the template to press against the heated film such that a portion of the film is deformed by the protrusions; separating the template from the film; and etching the film to remove a residual layer of the film to form a nano-imprinted photonic crystal waveguide.

Another embodiment of this invention fulfills these needs by providing a method for forming a nano-imprinted photonic crystal waveguide, comprising the steps of: a method for forming a nano-imprinted photonic crystal waveguide, comprising the steps of: preparing an optical film upon a substrate; preparing a template having a plurality of protrusions of less than 500 nm in length such that the protrusions are spaced a predetermined distance from each other; causing the template to modify a shape of the film; applying a UV light to the film and the template such that the film becomes polymerized; separating the template from the film; and etching the film to remove a residual layer of the film to form a nano-imprinted photonic crystal waveguide.

2. Description of the Related Art

Prior to the present invention, as set forth in general terms above and more specifically below, it is known, in the nano-imprinting art to employ thermal nano-imprinting techniques. In thermal nano-imprinting, the polymer is heated to a high temperature to soften it. A template is applied to pattern the softened polymer. When a thermalplastic polymer is used, the temperature is lowered to freeze to pattern. When a thermal-set polymer is used, the temperature is held at a critical temperature to activate polymerization and freeze in the pattern. Finally, the template is removed and the polymer now contains a nano imprint. While these thermal nano-imprinting techniques can be utilized to pattern a wide variety of devices, a more advantageous system would be provided if the thermal nano-imprinting technique could be utilized to produce photonic crystal waveguides.

It is also known, in the nano-imprinting art, to employ UV imprinting techniques. In UV nano-imprinting, polymers are liquid at room temperature. A template is applied to the liquid polymer film. The template and the polymer are then subjected to a UV light source that cures the polymer in order to freeze the pattern. Finally, the template is removed and the resist now contains a nano-imprint. While these UV nano-imprinting techniques can be utilized to pattern a wide variety of devices, a further advantageous system would be provided if the UV nano-imprinting technique could be used to produce photonic crystal waveguides.

It is also known that photonic crystal waveguides can be formed by utilizing electron beam lithography (EBL) and focused ion beam (FIB) milling. Although these techniques create high quality photonic crystal waveguides, they are much too slow and costly to allow for high volume manufacturing and integration of these devices into consumer products.

It is apparent from the above, that there exists a need in the art for an imprinting technique that is capable of utilizing various nano-imprinting techniques, but which the same time is capable of producing photonic crystal waveguides It is a purpose of this invention to fulfill this and other needs in the art in a manner more apparent to the skilled artisan once given the following disclosure.

SUMMARY OF THE INVENTION

Generally speaking, an embodiment of this invention fulfills these needs by providing a method for forming a nano-imprinted photonic crystal waveguide, comprising the steps of: preparing an optical film on a substrate; preparing a template having a plurality of protrusions of less than 500 nm in length such that the protrusions are spaced a predetermined distance from each other; heating the film; causing the template to press against the heated film such that a portion of the film is deformed by the protrusions; separating the template from the film; and etching the film to remove a residual layer of the film to form a nano-imprinted photonic crystal waveguide.

Another embodiment of this invention fulfills these needs by providing a method for forming a nano-imprinted photonic crystal waveguide, comprising the steps of: a method for forming a nano-imprinted photonic crystal waveguide, comprising the steps of: preparing an optical film upon a substrate; preparing a template having a plurality of protrusions of less than 500 nm in length such that the protrusions are spaced a predetermined distance from each other; causing the template to modify a shape of the film; applying a UV light to the film and the template such that the film becomes polymerized; separating the template from the film; and etching the film to remove a residual layer of the film to form a nano-imprinted photonic crystal waveguide.

In certain preferred embodiments, the substrate is constructed of silicon. Also, in certain preferred embodiments the optical film is constructed of silicon that has been bonded to the substrate with a layer of silicon oxide separating the two by a process known as wafer bonding. This type of substrate of a thin film of silicon bonded to a silicon substrate is typical known in the trade as Silicon-On-Insulator or SOI wafers.

Also, in certain preferred embodiments, the method is further comprised of the step of depositing a high etch selectivity material substantially over the resist and dissolving the resist to remove substantially all of the high etch selectivity material except that material that is in substantially direct contact with the film. Finally, the method is further comprised of the step of etching the optical film by using an RIE etch.

In another further preferred embodiment, relatively inexpensive methods for the formation of microscopic, high-quality photonic bandgap crystal waveguides and point defects with nanoscale lattice spacings are presented.

The preferred methods for forming a nano-imprinted photonic crystal waveguide, according to various embodiments of the present invention, offer the following advantages: ease-of-manufacture; improved economy; excellent waveguide characteristics; and good durability. In fact, in many of the preferred embodiments, these factors of ease of manufacture and excellent waveguide characteristics are optimized to an extent that is considerably higher than heretofore achieved in prior, known methods for forming photonic crystal waveguides.

The above and other features of the present invention, which will become more apparent as the description proceeds, are best understood by considering the following detailed description in conjunction with the accompanying drawings, wherein like characters represent like parts throughout the several views and in which:

DETAILED DESCRIPTION OF THE INVENTION

Figure 1A:
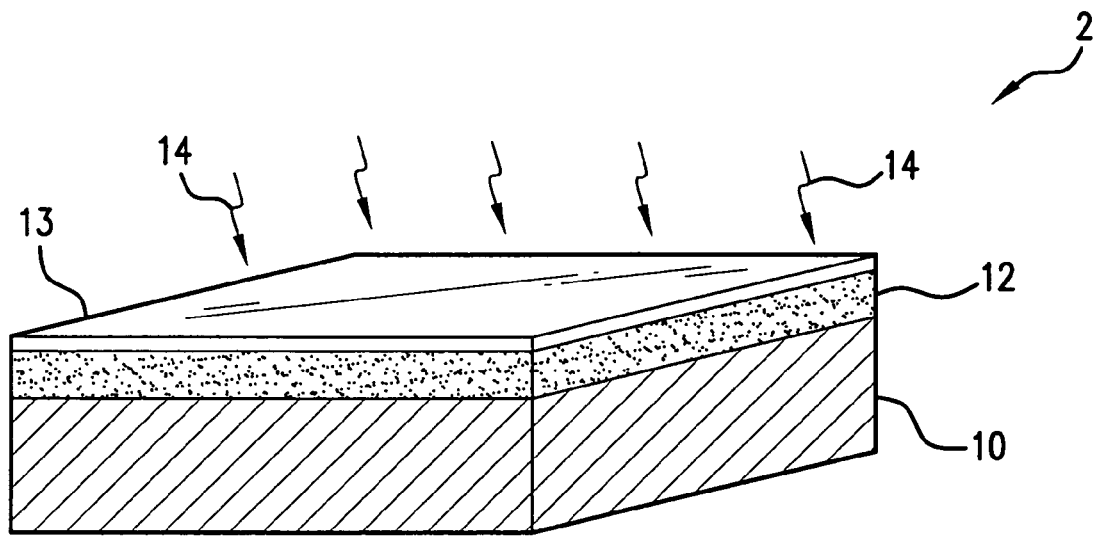
FIGS. 1a-1f depict a process sequence of a first embodiment for forming a nano-imprinted photonic crystal waveguide.

As an introduction to nano-imprinted photonic crystal waveguides, the following terms will be defined:

Nano-imprinted Photonic Crystal—An array of precisely located, geometrical holes in a polymeric or other optical film having certain dimensions that can be used as an optical semiconductor. The holes are precisely imprinted in the crystal to create photonic bandgaps that confine light.

Photonic Bandgaps—A photonic band gap is a range of wavelengths for which no states exist in the material for electromagnetic waves to occupy. Electromagnetic waves with wavelengths in the band gap are thus forbidden, and cannot propagate in the material. Artificial photonic bandgap structures can be created by forming subwavelength crystalline (periodic) structures in optical materials. The bandgap range can be tuned by selection of the optical material and changing the period and/or the fill ratio of the periodic structure.

Wavequide—A geometrical pathway through which electromagnetic waves are transmitted to the desired destination. For example, an optical fiber can be considered to be a waveguide. Useful photonic bandgap waveguides are created by introducing defects into the crystalline material structure, usually by removing elements from the periodic structure in the optical material, thus allowing propagation of photons through the material only where defects occur. Photonic bandgap waveguides are usually made of silicon.

Given the above definitions, and with reference first to FIG. 1, there is illustrated one preferred embodiment for use of the concepts of this invention. Specifically with regard to the process depicted in FIGS. 1a-1f, FIG. 1a illustrates a substrate 10, for example, silicon with an upper silicon oxide layer (not shown), on which an optical film 12 has been deposited or bonded by a process known as wafer bonding. This type of substrate in which a thin film of silicon is bonded to a silicon substrate is typically known in the trade as a Silicon-On-Insulator (SOI) wafer. The term "optical" is used to describe the film even though the light it carries can be outside the visible spectrum. Preferably, the substrate thickness is greater than 500 nm. Also, film 12 is, preferably, a film made of a suitable material inorganic material such as silicon or any suitable thermal-plastic or thermal-set polymer. Preferably, the film layer 12 thickness is on the order of a wavelength of the light in the optical film. A liquid polymer resist 13 is then deposited upon the optical film 12 such as by dropping, spinning or casting. The liquid polymer film 13 is further polymerized, and possibly cross-linked, to form a polymer film 13' (FIG. 1b), using heating 14 at temperatures below the glass transition temperature ($T_g$) of the polymer film 13. Preferably, film 13 is constructed of any suitable thermal-plastic or thermal-set polymer.

Figure 1B:
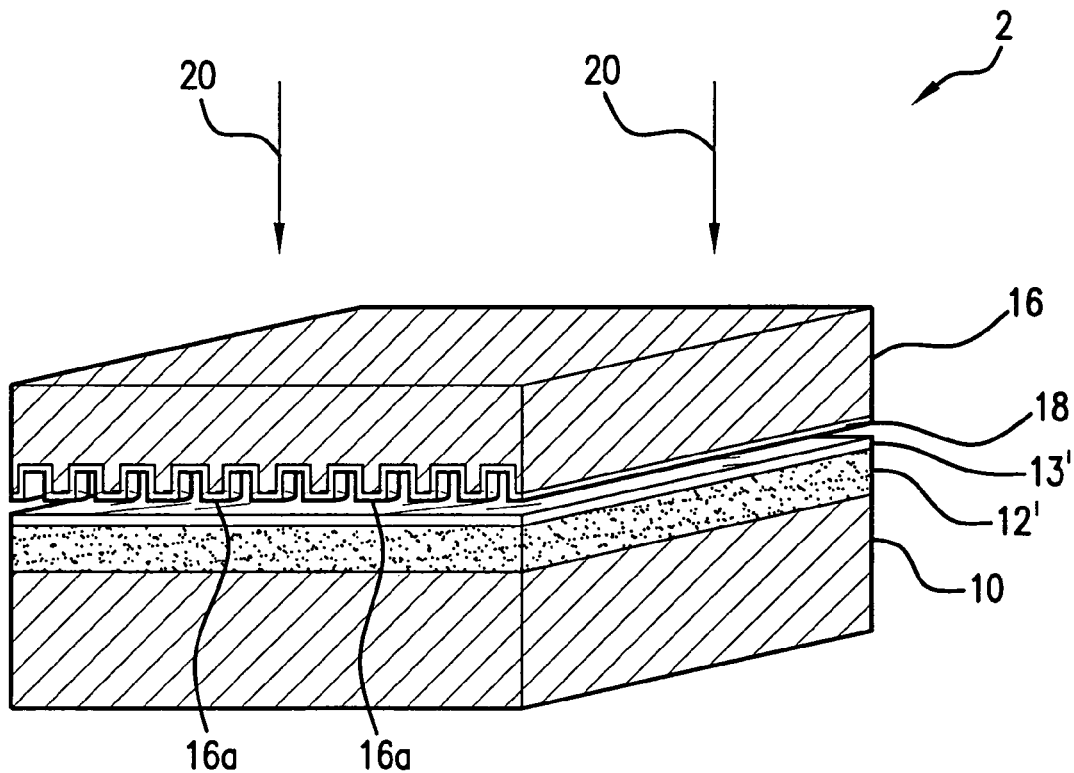

As shown in FIG. 1b, using heating 14 at a temperature above the glass transition temperature of the polymer film 13, a mold or template 16 provided with a release layer 18 is pressed into the polymer film 13', using pressure shown at 20. The mold or template 16 has formed therein a pattern comprising a plurality of protrusions 16a that can have critical dimensions of less than 450 nm in diameter and less than 500 nm in length (or etch depth), to be used in building nano-imprinted photonic crystal waveguides. Preferably, the protrusion length (or etch depth) is from 250 to 500 nm. Finally, the protrusions 16a have a hole gap at the narrowest point of approximately 100 nm. These protrusions 16a, upon imprinting, form a corresponding plurality of indentations 52 in the polymer film 13', in FIG. 1c. It is to be understood that protrusions 16a can be constructed of any suitable polygonal shape, such as cylindrical, circular, rectangular, rhombic, hexagonal, triangular, or parallelogram. It is also to be understood that the spatial period of the structure, Λ, is governed by the following equation 1:

$$\Lambda = (\lambda - d_h/n_{air})n_{film} + d_h \qquad \text{(Equation 1)},$$

where Λ is the period of the photonic crystal waveguide, λ is the vacuum wavelength of the light used, $d_h$ is diameter of the holes; $n_{air}$ is index of refraction of air (~1); and $n_{film}$ is index of refraction of the optical film. The size of the protrusions 16a and their periodicity are optimized to obtain the desired property for the photonic crystal.

The temperature of imprinting is above the glass transition temperature ($T_g$) of the polymer film 13' and typically 60 to 500° C. The pressure of the imprinting is within the range of 0.25 to 2000 psi. Finally, the hold down times range from 1 second to 20 minutes.

Figure 1C:
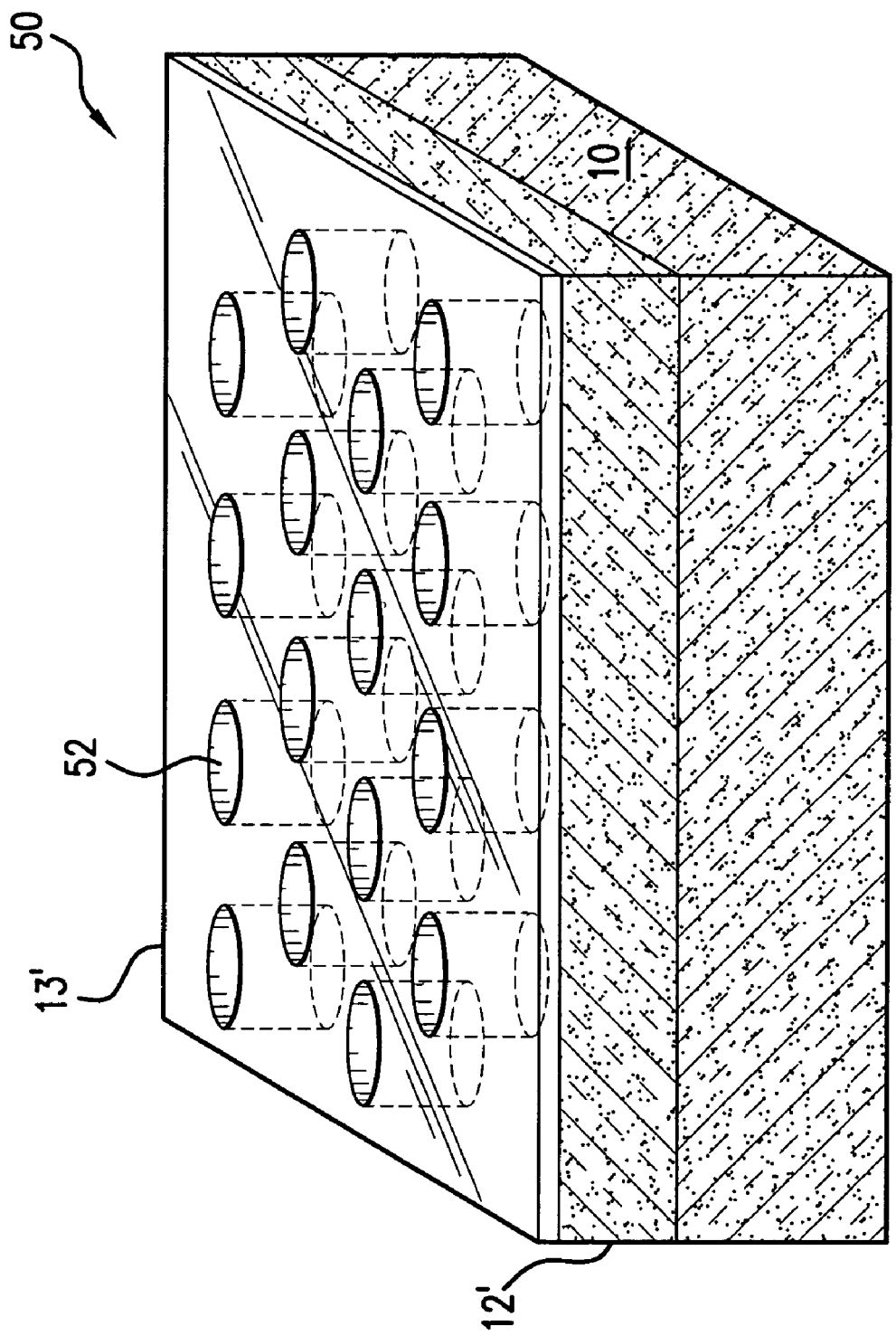
Figure 1D:
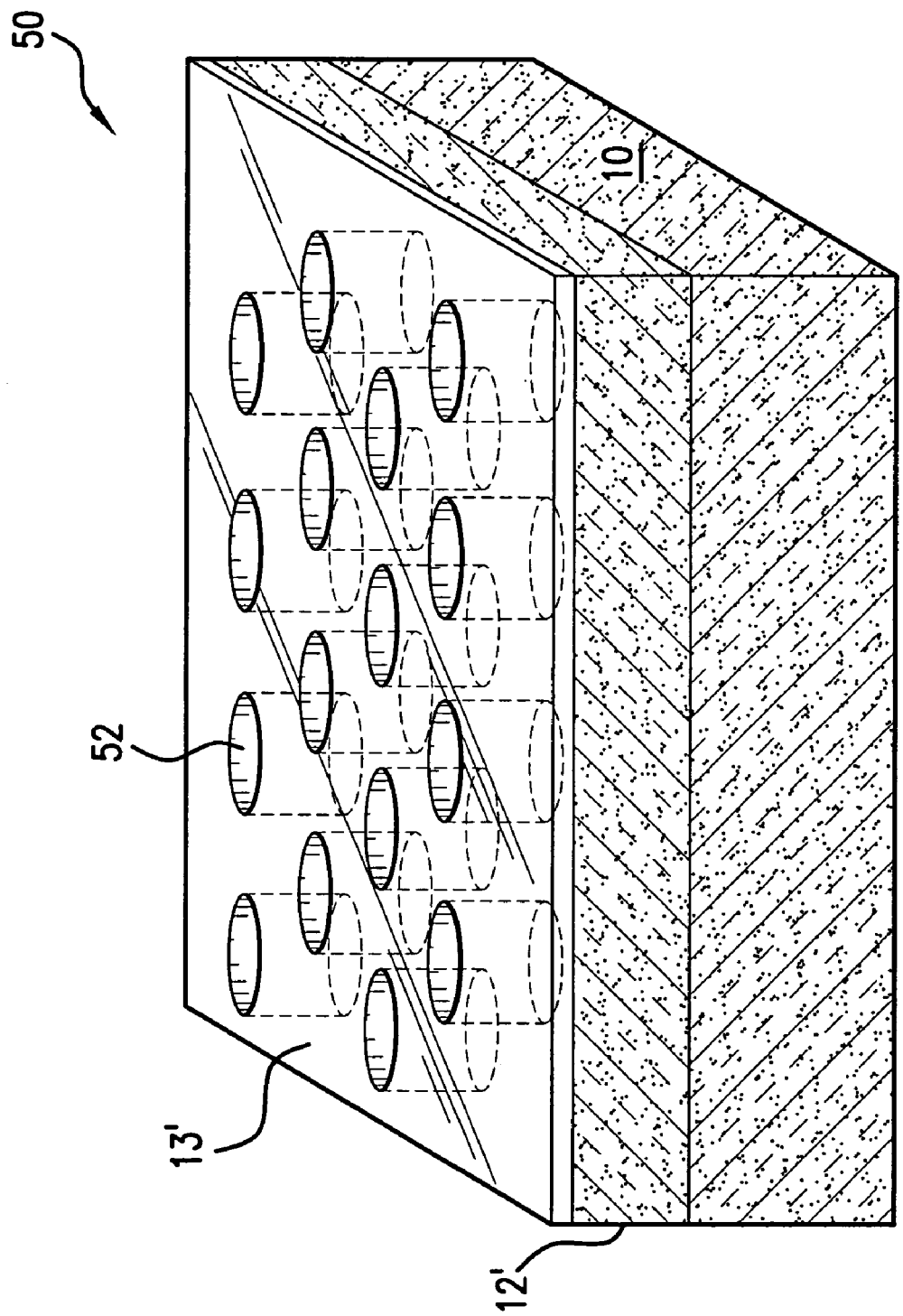
Figure 1E:
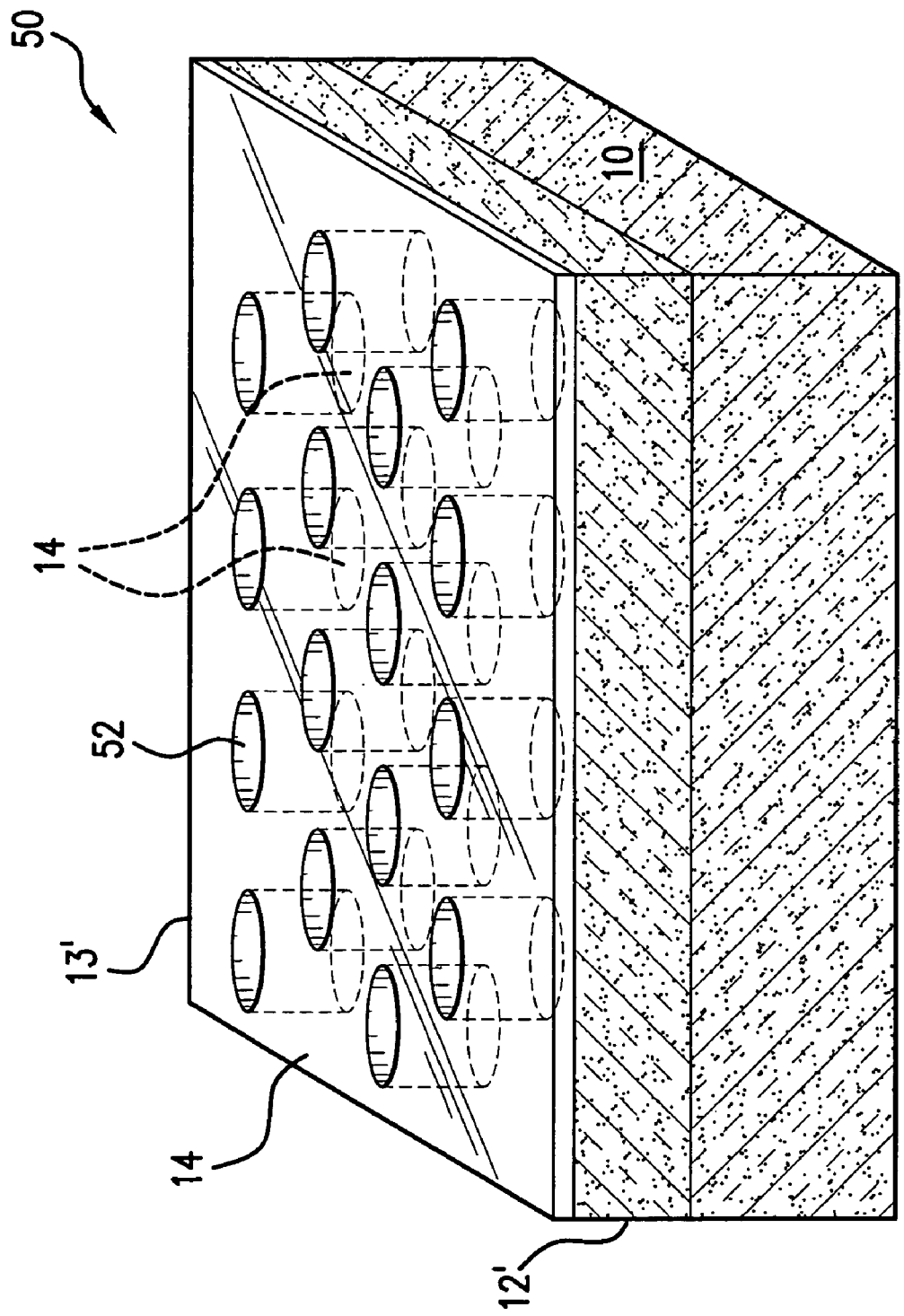
Figure 1F:
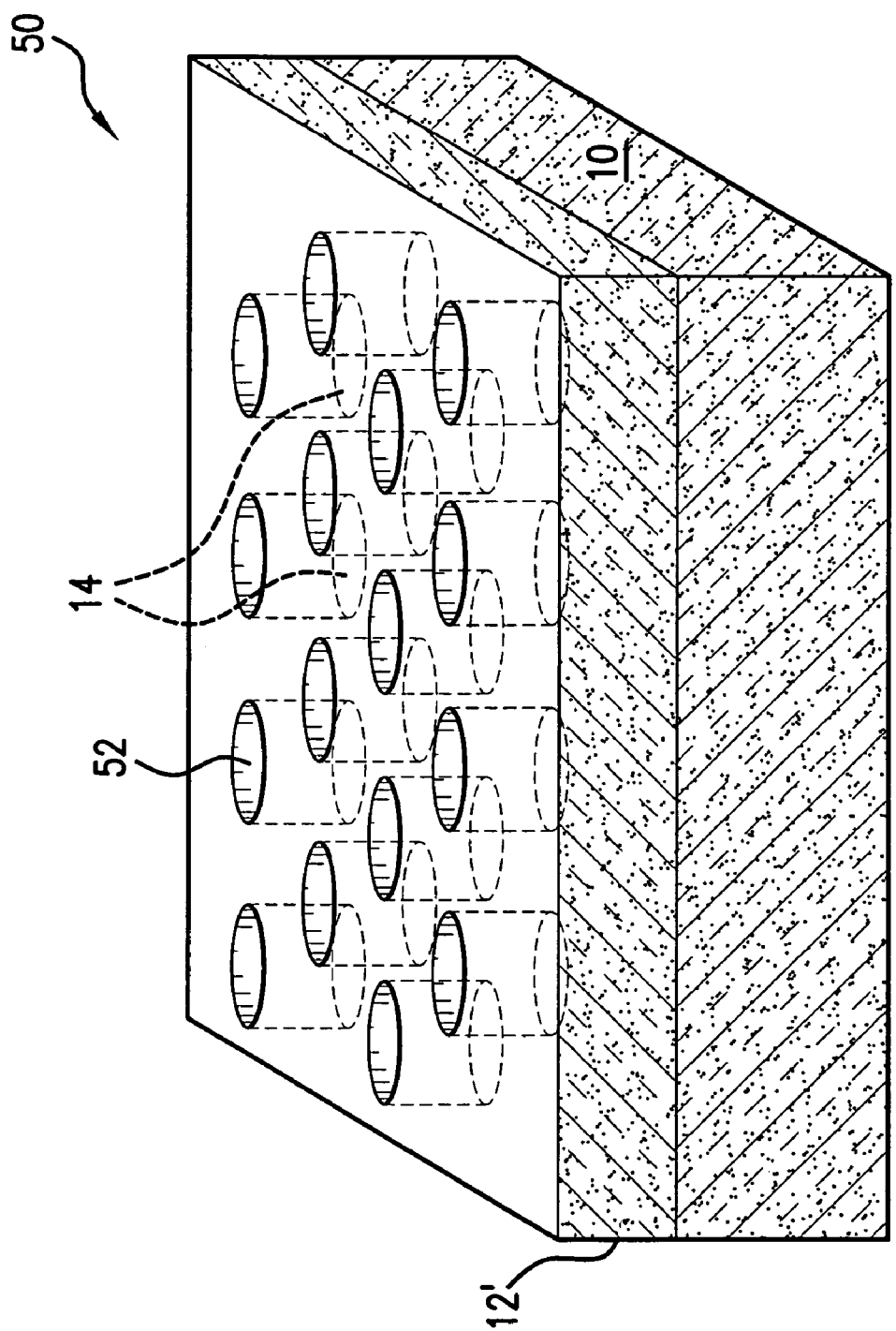

Once the pattern has been transferred into the polymer film 13', then the polymer film is conventionally blanket etched, such as with a plasma, to remove the residual layer of the polymer film 13, as shown in FIG. 1d. A high etch selectivity material layer 14 is then deposited over films 12' and 13', as shown in FIG. 1e. Preferably, the high etch selectivity material can be chromium (chrome) or aluminum. A conventional solvent is then used to dissolve layer 13' and release layer 14 such that only where material layer 14 is in direct contact with the optical film layer 12', does layer 14 remain. In this case, layer 14 is only at the bottom of indentations 52, as shown in FIG. 1f. Layer 14 may then be used as an etch mask for etching the pattern into the optical film using reactive ion etching (RIE). Following the etching, the patterned optical film 12' can then be further processed to produce a photonic crystal waveguide device. For example, a conventional optical sender and optical receiver can be installed at opposite ends of crystal 50 to produce a photonic crystal waveguide device.

Alternative procedures are also well known for etching into the polymer and optical films 12' and 13', and these are also suitably employed herein. The procedures disclosed herein have broad applications in use beyond nano-technology imprinting applications. Specifically, the procedures disclosed herein can be used in any imprinting process presently replacing conventional photolithography, focused ion beam (FIB) milling or electron beam lithography (EBL).

It is also to be understood that this invention could provide a method for forming a nano-imprinted photonic crystal waveguide by merely depositing the optical, inorganic film 12 onto or bonding the optical, inorganic film 12 to the substrate 10. A liquid polymer resist 13 is then deposited upon the optical film 12, by dropping, spinning or casting. The mold or template 16 is then prepared with a plurality of protrusions 16a of less than 500 nm in length such that the protrusions 16a are spaced a predetermined distance from each other. Films 12 and 13 are heated and mold or template 16 presses against the heated film 13' such that a portion of the film 13' is deformed by the protrusions 16a. The mold or template 16 is separated from the film 13'. A blanket etch process is used on the film 13' to remove residual material from the bottom of the imprinted features. Finally, the film 12' is exposed to the RIE to form a nano-imprinted photonic crystal waveguide.

It is also to be understood that this invention could provide a method for forming a nano-imprinted photonic crystal waveguide by merely depositing the optical, thermal-plastic or thermal-set polymer film 12 onto or bonding the optical, thermal-plastic or thermal-set polymer, optical film 12 to the substrate 10 by dropping, spinning or casting. The mold or template 16 is then prepared with a plurality of protrusions 16a of less than 500 nm in length such that the protrusions 16a are spaced a predetermined distance from each other. Film 12 is heated and mold or template 16 presses against the heated film 12' such that a portion of the film 12' is deformed by the protrusions 16a. The mold or template 16 is separated from the film 12'. Finally, a blanket etch process is used on the film 12' to remove residual material from the bottom of the imprinted features to form a nano-imprinted photonic crystal waveguide.

With regard to FIGS. 2a-2e, FIG. 2a illustrates a substrate 10, for example, silicon, on which an optical film 12 has been deposited or bonded. Preferably, the substrate thickness is greater than 500 nm. Also, film 12 is, preferably, a suitable, photo-activated or inorganic optical film. Preferably, the film layer 12 thickness is on the order of a wavelength of the light in the optical film. A liquid polymer resist 13 is then deposited upon the optical film 12 such as by dropping, spinning or casting. Preferably, film 13 is constructed of any suitable, photo activated polymer.

A mold or template 16 provided with a release layer 18 is pressed into the polymer film 13', using pressure shown at 22. The mold or template 16 has formed therein a pattern comprising a plurality of protrusions 16a that can have critical dimensions of less than 450 nm in diameter and less than 500 nm in length (or etch depth), to be used in building nano-imprinted photonic crystal waveguides. Preferably, the protrusion length (or etch depth) is from 250 to 500 nm. These protrusions 16a, upon imprinting, form a corresponding plurality of indentations 52 in the optical film 12', as shown in the crystal 50 in FIG. 2b. It is to be understood that protrusions 16a can be constructed of any suitable polygonal cylindrical shape, such as cylindrical, circular, rectangular, rhombic, hexagonal, triangular, or parallelogram.

The temperature of imprinting is preferably ambient. The pressure of the imprinting is within the range of 0.25 and 2000 psi. Finally, the hold down times range from 1 second to 20 minutes.

Figure 2A:
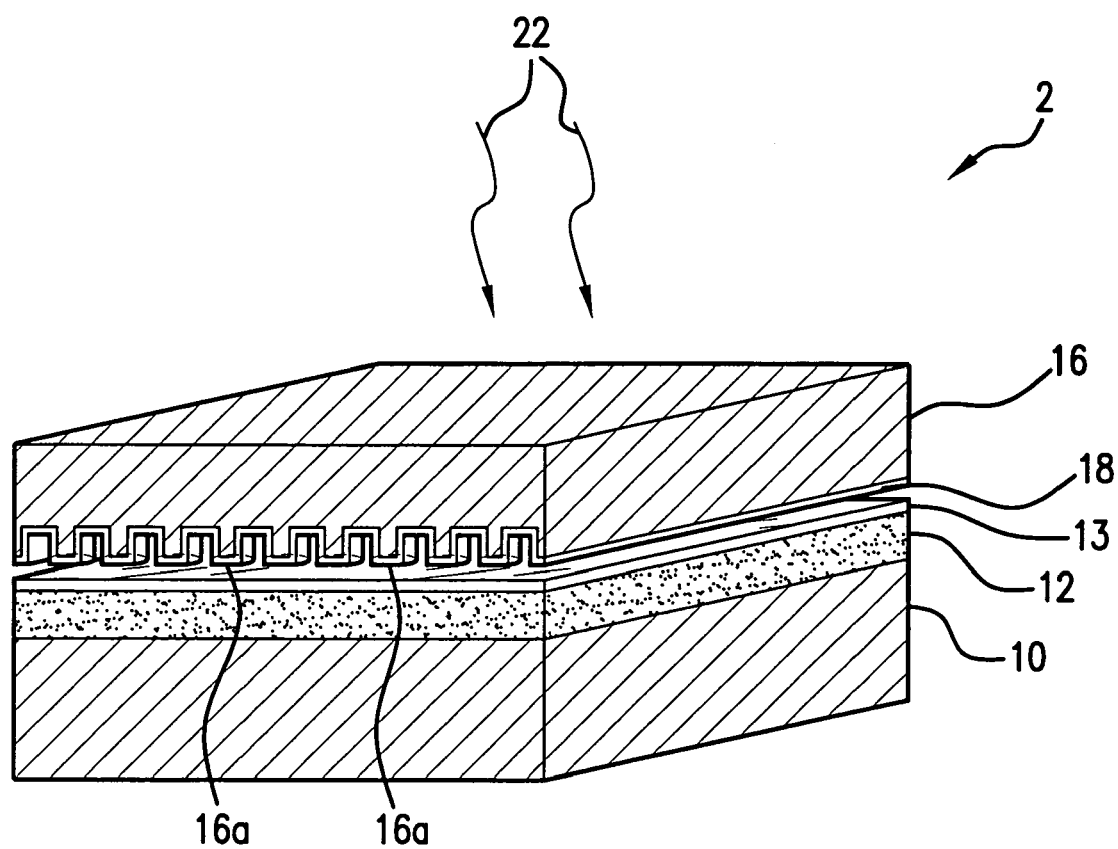
FIGS. 2a-2e depict a process sequence of a second embodiment for forming a nano-imprinted photonic crystal waveguide.
Figure 2B:
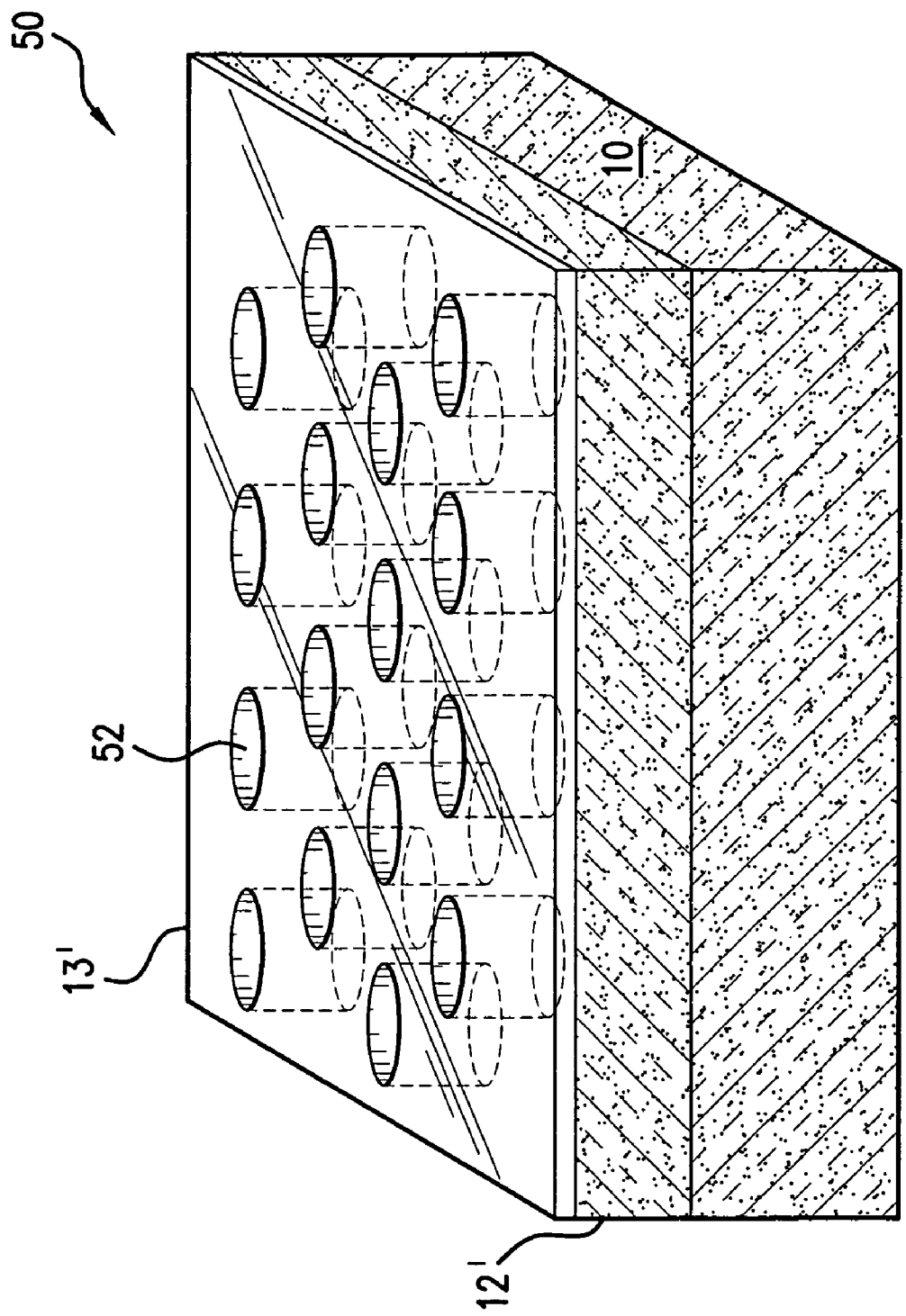
Figure 2C:
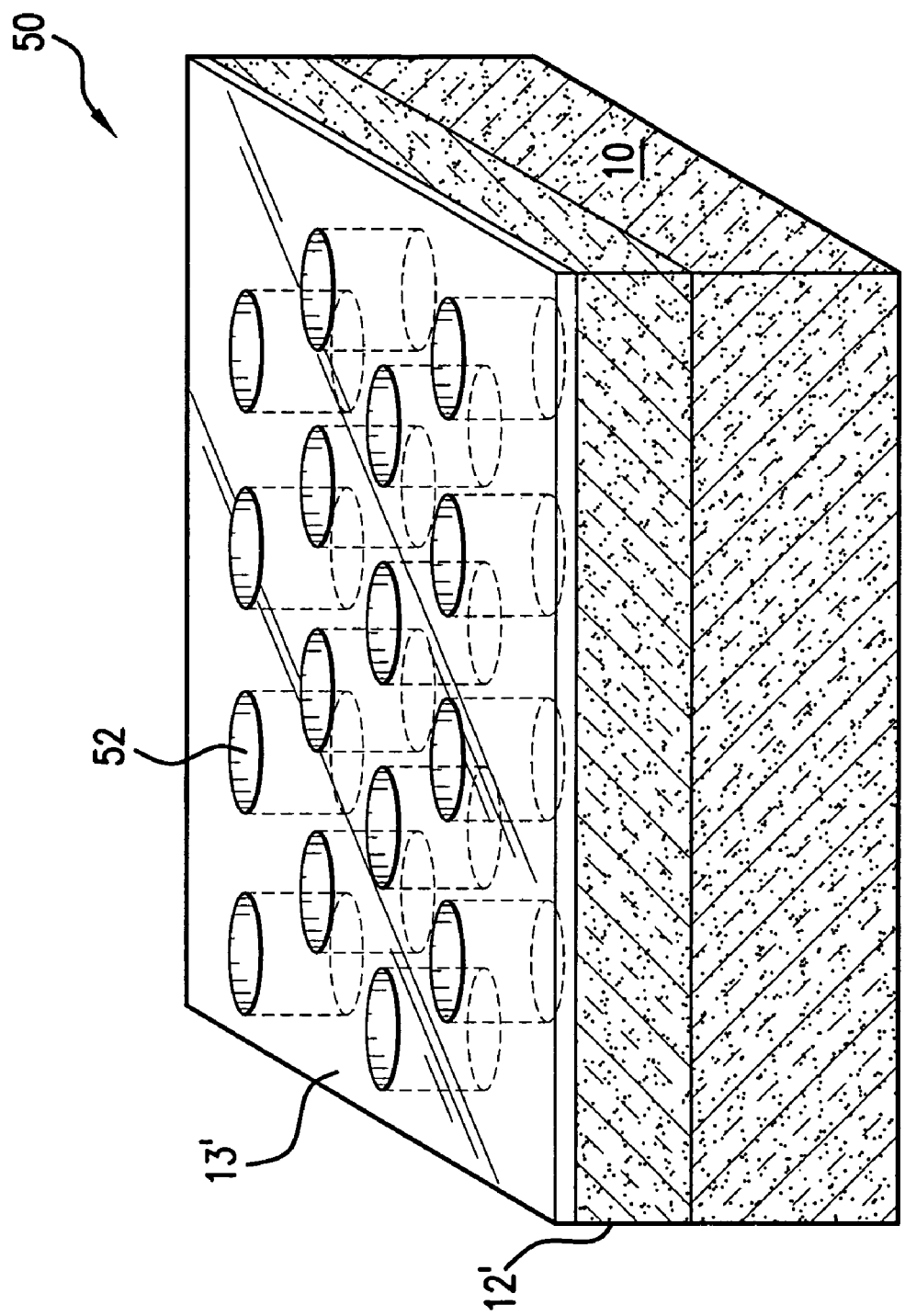
Figure 2D:
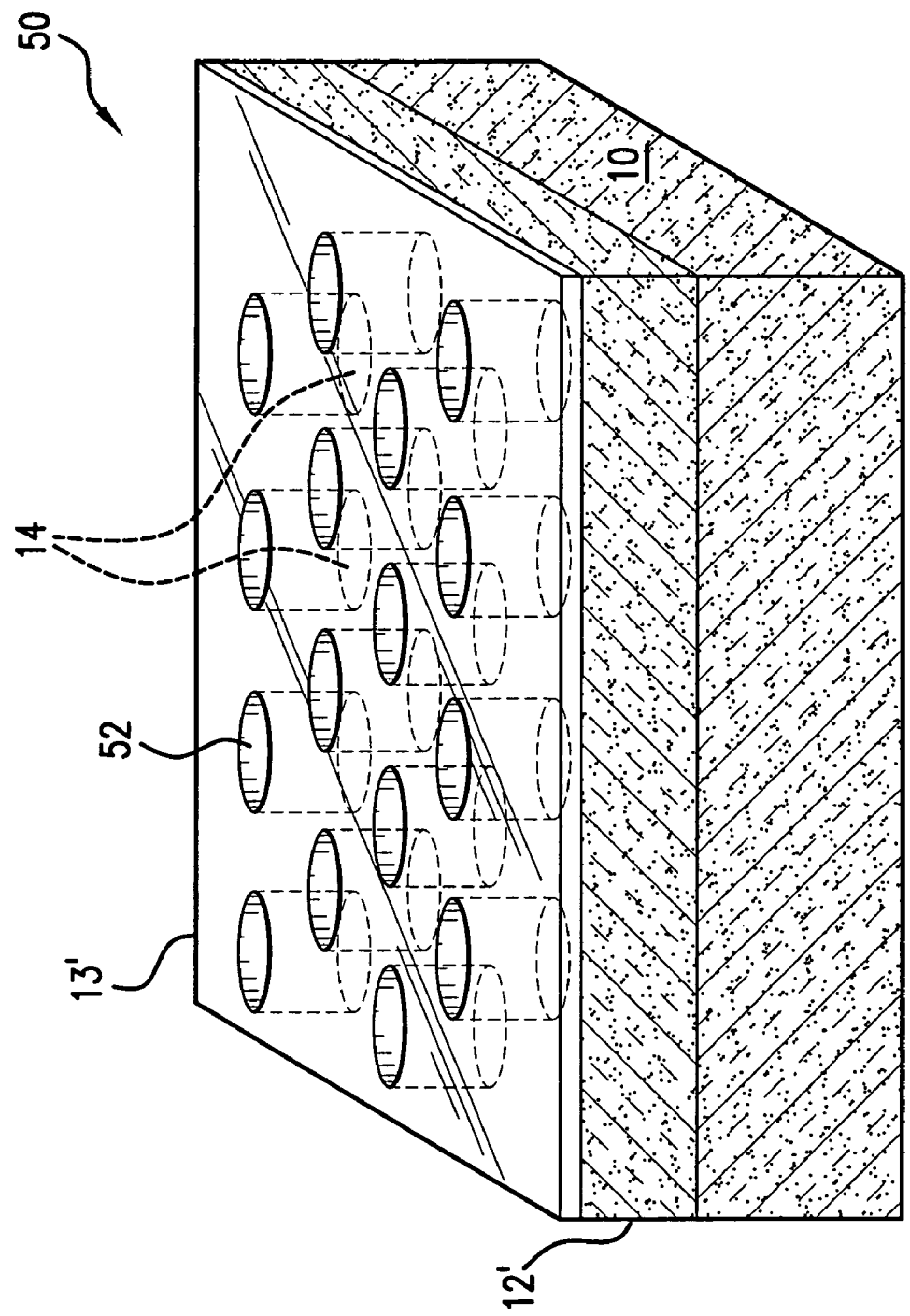
Figure 2E:
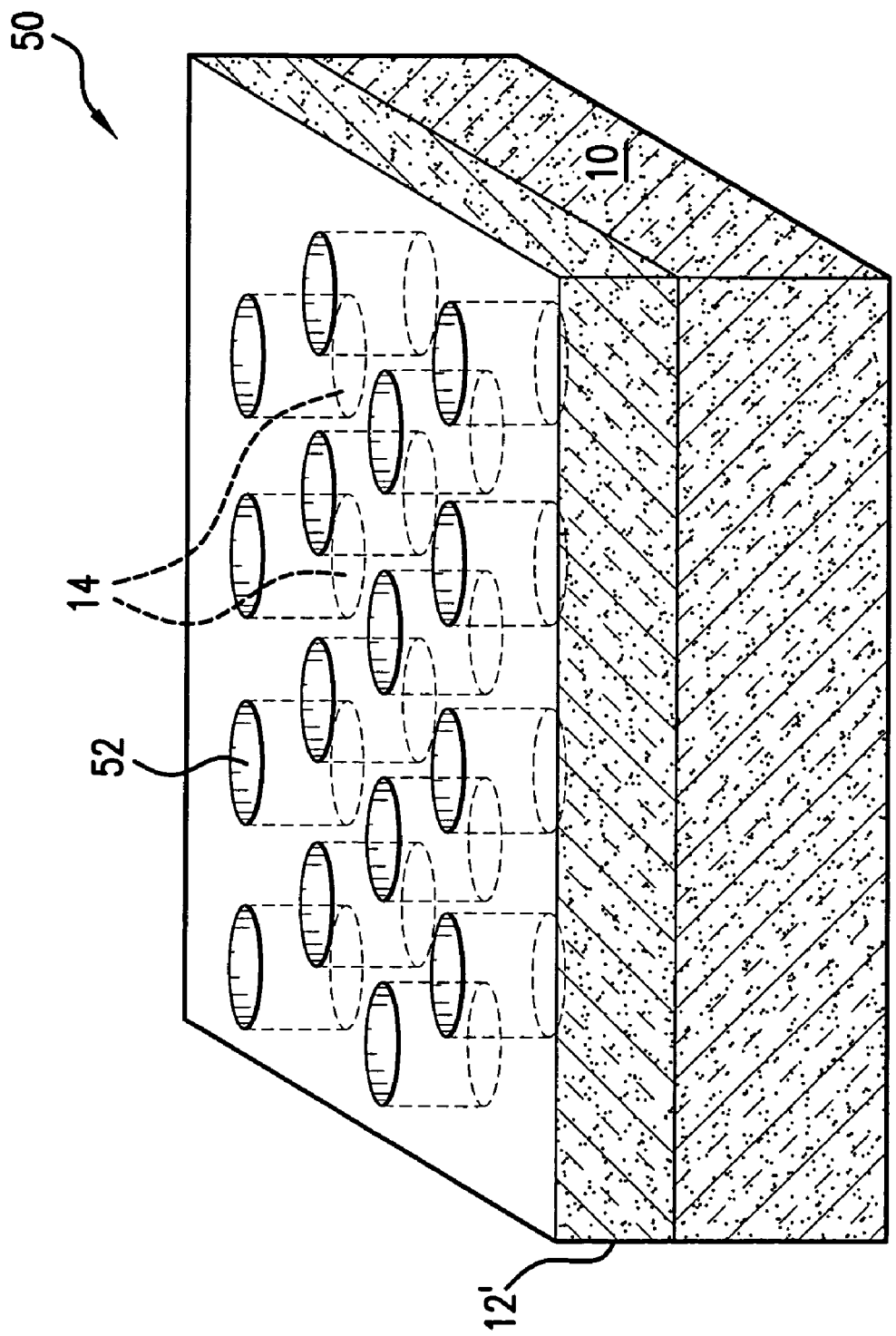

Once the pattern has been transferred into the polymer film 13', then the polymer film is conventionally blanket etched, such as with a plasma, to expose portions of the underlying optical film 12', as shown in FIG. 2c. A high etch selectivity material layer 14 is then deposited over films 12' and 13', as shown in FIG. 2d. Preferably, the high etch selectivity material can be chromium (chrome) or aluminum. A conventional solvent is then used to dissolve layer 13' and substantially release layer 14 such that only where material layer 14 is in direct contact with the optical film layer 12', does layer 14 remain. In this case, layer 14 is only located at the bottom of indentations 52, as shown in FIG. 2e. The layer 14 may then be used as an etch mask for etching the pattern into the film 12' using reactive ion etching (RIE). Following the etching, the patterned optical film 12' can then be further processed to produce a photonic crystal waveguide device. For example, a conventional optical sender and optical receiver can be installed at opposite ends of crystal 50 to produce a photonic crystal device.

It is also to be understood that this invention could provide a method for forming a nano-imprinted photonic crystal waveguide by merely depositing the optical, inorganic film 12 onto or bonding the optical, inorganic film 12 to the substrate 10. A liquid polymer resist 13 is then deposited upon the optical film 12, by dropping, spinning or casting. The mold or template 16 is prepared with a plurality of protrusions 16a of less than 500 nm in length such that the protrusions 16a are spaced a predetermined distance from each other. The imprinting process is performed immediately on the film 13' to form the pattern in the liquid layer, which is then further polymerized and possibly cross-linked within polymer chains, by applying ultra-violet radiation 22 with the mold or template 16 in place, as illustrated in FIG. 2a. Preferably, the UV radiation is applied at a dose of 500 to 2000 milli-watts per square cm.

The pattern transfer, shown in FIG. 2b, is identical to the pattern transfer in FIG. 1c. An etching, such as the process with plasma discussed above, is performed, to remove the polymer residual layer and expose potions of the optical film 12'. The polymer film may then be used as an etch mask for etching the pattern into the optical film 12' using an RIE etch. Following the etching, the nano-imprinted photonic crystal 50 is then further processed, as described above. In this case, the imprinting process is carried out on the liquid film 13' at even lower temperatures than specified above for the solid polymer film 13 (FIGS. 1a-f), possibly as low as room temperature (about 23° C.), depending on the material comprising the polymer solution and the initiator.

It is also to be understood that this invention could provide a method for forming a nano-imprinted photonic crystal waveguide by merely depositing the optical, photo-activated film 12 onto or bonding the optical, photo-activated, optical film 12 to the substrate 10 by dropping, spinning or casting. The mold or template 16 is then prepared with a plurality of protrusions 16a of less than 500 nm in length such that the protrusions 16a are spaced a predetermined distance from each other. Template 16 immediately contacts film 12' such that a portion of the film 12' is deformed by the protrusions 16a. The imprinting process is performed immediately on the film 12 to form the pattern in the film 12', which is then further polymerized and possibly cross-linked within polymer chains, by applying ultra-violet radiation 22 with the mold or template 16 in place. The mold or template 16 is separated from the film 12'. Finally, a blanket etch process is used on the film 12' to remove residual material from the bottom of the imprinted features to form a nano-imprinted photonic crystal waveguide.

It is to be further understood that mold or template 16 and protrusions 16a can be constructed of the same or similar materials and in the same or similar manner as indentations 52 as in the process illustrated in FIG. 1a-1f.

Also, the present invention can be embodied in any computer-readable medium for use by or in connection with an instruction-execution system, apparatus or device such as a computer/processor based system, processor-containing system or other system that can fetch the instructions from the instruction-execution system, apparatus or device, and execute the instructions contained therein. In the context of this disclosure, a "computer-readable medium" can be any means that can store, communicate, propagate or transport a program for use by or in connection with the instruction-execution system, apparatus or device. The computer-readable medium can comprise any one of many physical media such as, for example, electronic, magnetic, optical, electro-magnetic, infrared, or semiconductor media. More specific examples of a suitable computer-readable medium would include, but are not limited to, a portable magnetic computer diskette such as floppy diskettes or hard drives, a random access memory (RAM), a read-only memory (ROM), an erasable programmable read-only memory, or a portable compact disc. It is to be understood that the computer-readable medium could even be paper or another suitable medium upon which the program is printed, as the program can be electronically captured, via, for instance, optical scanning of the paper or other medium, then compiled, interpreted or otherwise processed in a single manner, if necessary, and then stored in a computer memory.

Those skilled in the art will understand that various embodiments of the present invention can be implemented in hardware, software, firmware or combinations thereof. Separate embodiments of the present invention can be implemented using a combination of hardware and software or firmware that is stored in memory and executed by a suitable instruction-execution system. If implemented solely in hardware, as in an alternative embodiment, the present invention can be separately implemented with any or a combination of technologies which are well known in the art (for example, discrete-logic circuits, application-specific integrated circuits (ASICs), programmable-gate arrays (PGAs), field-programmable gate arrays (FPGAs), and/or other later developed technologies. In preferred embodiments, the present invention can be implemented in a combination of software and data executed and stored under the control of a computing device.

It will be well understood by one having ordinary skill in the art, after having become familiar with the teachings of the present invention, that software applications may be written in a number of programming languages now known or later developed.

Once given the above disclosure, many other features, modifications or improvements will become apparent to the skilled artisan. Such features, modifications or improvements are, therefore, considered to be a part of this invention, the scope of which is to be determined by the following claims.

What is claimed is:

1. A method for forming a nano-imprinted photonic crystal waveguide, comprising the steps of:
    preparing an optical film upon a substrate;
    preparing a template having a plurality of protrusions of less than 500 nm in length such that the protrusions are spaced a predetermined distance from each other;
    heating the film;
    causing the template to press against the heated film such that a portion of the film is deformed by the protrusions;
    separating the template from the film; and
    etching the film to remove a residual layer of the film to form a nano-imprinted photonic crystal waveguide.

2. The method, as in claim 1, where the film is comprised of:
    a thermal-plastic polymer.

3. The method, as in claim 1, where the film is comprised of:
    a thermal-set polymer.

4. The method, as claim 1, wherein the method is further comprised of the steps of:
    depositing a polymer resist upon the optical film;
    heating the resist;
    causing the template to press against the heated resist such that a portion of the resist is deformed by the protrusions;
    separating the template from the resist; etching the resist to remove the residual layer; and
    etching the optical film to form the nano-imprinted photonic crystal waveguide.

5. The method, as in claim 4, where the optical film is comprised of:
    an inorganic material.

6. The method, as in claim 5, where the optical film is comprised of:
    silicon.

7. The method, as in claim 4, where the polymer resist is comprised of:
    a thermal-plastic polymer.

8. The method, as in claim 4, where the polymer resist is comprised of:
    a thermal-set polymer.

9. The method, as in claim 1, wherein the protrusions have a diameter of less than 450 nm.

10. The method, as in claim 1, wherein a protrusion length is greater than 250 nm.

11. The method, as in claim 1, wherein a spatial period of the waveguide, $\Lambda$, is governed by the following equation:

$$\Lambda = (\lambda - d_h/n_{air})n_{film} + d_h,$$

where $\Lambda$ is the period of the photonic crystal waveguide, $\lambda$ is a vacuum wavelength of the light used, $d_h$ is diameter of the holes; $n_{air}$ is index of refraction of air (~1), and $n_{film}$ is index of refraction of the optical film.

12. The method, as in claim 1, wherein the protrusions have a hole gap at their narrowest point of approximately 100 mm.

13. The method, as in claim 1, wherein the heating step is further comprised of the step of:
    heating the film to above its glass transition temperature.

14. The method, as in claim 1, wherein the causing step is further comprised of the step of:
    holding the mold in place for at least 1 second.

15. The method, as in claim 1, wherein the causing step is further comprised of the step of:
    applying a pressure of at least 0.25 psi.

16. The method, as in claim 4, wherein the heating step is further comprised of the step of:
    heating the resist to above its glass transition temperature.

17. The method, as in claim 4, wherein the causing step is further comprised of the step of:
    holding the mold in place for at least 1 second.

18. The method, as in claim 4, wherein the causing step is further comprised of the step of:
    applying a pressure of at least 0.25 psi.

19. The method, as in claim 4, wherein the method is further comprised of the step of:
    depositing a high etch selectivity material substantially over the resist.

20. The method, as in claim 19, wherein the material is further comprised of:
    chromium (chrome).

21. The method, as in claim 19, wherein the deposition step is further comprised of the step of:
    removing substantially all of the high etch selectivity material except that material that is in substantially direct contact with the film.

22. The method, as in claim 4, wherein the method is further comprised of the step of:
    etching the optical film by using an RIE etch.

23. The method, as in claim 21, wherein the method is further comprised of the step of:
    etching the optical film by using an RIE etch.

24. A method for forming a nano-imprinted photonic crystal waveguide, comprising the steps of:

preparing an optical film upon a substrate;
preparing a template having a plurality of protrusions of less than 500 nm in length such that the protrusions are spaced a predetermined distance from each other;
causing the template to modify a shape of the film;
applying a UV light to the film and the template such that the film becomes polymerized;
separating the template from the film; and
etching the film to remove a residual layer of the film to form a nano-imprinted photonic crystal waveguide.

25. The method, as claim 24, wherein the film is further comprised of:
a photo activated polymer.

26. The method, as claim 24, wherein the method is further comprised of the steps of:
depositing a polymer resist upon the optical film;
causing the template to modify a shape of the resist;
applying a UV light to the resist and the template such that the resist becomes polymerized;
separating the template from the resist;
etching the resist to remove a residual layer; and
etching the optical film to form the nano-imprinted photonic crystal waveguide.

27. The method, as in claim 26, where the optical film is comprised of:
an inorganic material.

28. The method, as in claim 27, where the optical film is comprised of:
silicon.

29. The method, as claim 26, wherein the resist is further comprised of:
a photo activated polymer.

30. The method, as in claim 24, wherein the protrusions have a diameter of less than 450 nm.

31. The method, as in claim 24, wherein the protrusion length is greater than 250 nm.

32. The method, as in claim 24, wherein a spatial period of the waveguide, Λ, is governed by the following equation:

$$\Lambda = (\lambda - d_h/n_{air})n_{film} + d_h,$$

where Λ is the period of the photonic crystal waveguide, is a vacuum wavelength of the light used, $d_h$ is diameter of the holes; $n_{air}$ is index of refraction of air (~4), and $n_{film}$ is index of refraction of the optical film.

33. The method, as in claim 24, wherein the protrusions have a hole gap at their narrowest point of approximately 100 nm.

34. The method, as in claim 24, wherein the UV applying step is further comprised of the step of:
applying the UV light at a dose of at least 500 milli-watts per cm squared.

35. The method, as in claim 26, wherein the UV applying step is further comprised of the step of:
applying the UV light at a dose of at least 500 milli-watts per cm squared.

36. The method, as in claim 26, wherein the method is further comprised of the step of:
depositing a high etch selectivity material substantially over the resist.

37. The method, as in claim 36, wherein the material is further comprised of:
chromium (chrome).

38. The method, as in claim 36, wherein the deposition step is further comprised of the step of:
removing substantially all of the high etch selectivity material except that material that is in substantially direct contact with the film.

39. The method, as in claim 26, wherein the method is further comprised of the step of:
etching the optical film by using an RIE etch.

40. The method, as in claim 38, wherein the method is further comprised of the step of:
etching the optical film by using an RIE etch.

41. A program storage medium readable by a computer, tangibly embodying a program of instructions executable by the computer to perform the method steps for forming a nano-imprinted photonic crystal waveguide, comprising the steps of:
preparing an optical film upon a substrate;
preparing a template having a plurality of protrusions of less than 500 nm in length such that the protrusions are spaced a predetermined distance from each other;
heating the film;
causing the template to press against the heated film such that a portion of the film is deformed by the protrusions;
separating the template from the film; and
etching the film to remove a residual layer of the film to form a nano-imprinted photonic crystal waveguide.

42. The method, as in claim 41, where the film is comprised of:
a thermal-plastic polymer.

43. The method, as in claim 41, where the film is comprised of:
a thermal-set polymer.

44. The method, as in claim 41, wherein the method is further comprised of the steps of:
depositing a polymer resist upon the optical film;
heating the resist;
causing the template to press against the heated resist such that a portion of the resist is deformed by the protrusions;
separating the template from the resist;
etching the resist to remove the residual layer; and
etching the optical film to form the nano-imprinted photonic crystal waveguide.

45. The method, as in claim 44, where the optical film is comprised of:
an inorganic material.

46. The method, as in claim 45, where the optical film is comprised of:
silicon.

47. The method, as in claim 44, where the polymer resist is comprised of:
a thermal-plastic polymer.

48. The method, as in claim 44, where the polymer resist is comprised of:
a thermal-set polymer.

49. The method, as in claim 41, wherein the protrusions have a diameter of less than 450 um.

50. The method, as in claim 41, wherein a protrusion length is greater than 250 nm.

51. The method, as in claim 41, wherein a spatial period of the waveguide, Λ, is governed by the following equation:

$$\Lambda = (\lambda - d_h/n_{air})n_{film} + d_h,$$

where Λ is the period of the photonic crystal waveguide, λ is a vacuum wavelength of the light used, $d_h$ is diameter of the holes; $n_{air}$ is index of refraction of air (~1), and $n_{film}$ is index of refraction of the optical film.

52. The method, as in claim 41, wherein the protrusions have a hole gap at their narrowest point of approximately 100 nm.

53. The method, as in claim 41, wherein the heating step is further comprised of the step of:
   heating the film to above its glass transition temperature.

54. The method, as in claim 41, wherein the causing step is further comprised of the step of:
   holding the mold in place for at least 1 second.

55. The method, as in claim 41, wherein the causing step is further comprised of the step of:
   applying a pressure of at least 0.25 psi.

56. The method, as in claim 44, wherein the heating step is further comprised of the step of:
   heating the resist to above its glass transition temperature.

57. The method, as in claim 44, wherein the causing step is further comprised of the step of:
   holding the mold in place for at least 1 second.

58. The method, as in claim 44, wherein the causing step is further comprised of the step of:
   applying a pressure of at least 0.25 psi.

59. The method, as in claim 44, wherein the method is further comprised of the step of:
   depositing a high etch selectivity material substantially over the resist.

60. The method, as in claim 59, wherein the material is further comprised of:
   chromium (chrome).

61. The method, as in claim 59, wherein the deposition step is further comprised of the step of:
   removing substantially all of the high etch selectivity material except that material that is in substantially direct contact with the film.

62. The method, as in claim 44, wherein the method is further comprised of the step of:
   etching the optical film by using an RIE etch.

63. The method, as in claim 61, wherein the method is further comprised of the step of:
   etching the optical film by using an RIE etch.

64. A program storage medium readable by a computer, tangibly embodying a program of instructions executable by the computer to perform the method steps for forming a nano-imprinted photonic crystal waveguide, comprising the steps of:
   preparing an optical film upon a substrate;
   preparing a template having a plurality of protrusions of less than 500 nm in length such that the protrusions are spaced a predetermined distance from each other;
   causing the template to modify a shape of the film;
   applying a UV light to the film and the template such that the film becomes polymerized;
   separating the template from the film; and
   etching the film to remove a residual layer of the film to form a nano-imprinted photonic crystal waveguide.

65. The method, as claim 64, wherein the film is further comprised of:
   a photo activated polymer.

66. The method, as claim 64, wherein the method is further comprised of the steps of:
   depositing a polymer resist upon the optical film;
   causing the template to modify the shape of the resist;
   applying a UV light to the resist and the template such that the resist becomes polymerized;
   separating the template from the resist;
   etching the resist to remove a residual layer; and
   etching the optical film to form the nano-imprinted photonic crystal waveguide.

67. The method, as in claim 66, where the optical film is comprised of:
   an inorganic material.

68. The method, as in claim 67, where the optical film is comprised of:
   silicon.

69. The method, as claim 66, wherein the resist is further comprised of:
   a photo activated polymer.

70. The method, as in claim 64, wherein the protrusions have a diameter of less than 450 nm.

71. The method, as in claim 64, wherein the protrusion length is greater than 250 nm.

72. The method, as in claim 64, wherein a spatial period of the waveguide, $\Lambda$, is governed by the following equation:

$$\Lambda = (\lambda - d_h/n_{air})n_{film} + d_h,$$

where $\Lambda$ is the period of the photonic crystal waveguide, $\lambda$ is a vacuum wavelength of the light used, $d_h$ is diameter of the holes; $n_{air}$ is index of refraction of air (~1), and $n_{film}$ is index of refraction of the optical film.

73. The method, as in claim 64, wherein the protrusions have a hole gap at their narrowest point of approximately 100 nm.

74. The method, as in claim 64, wherein the UV applying step is further comprised of the step of:
   applying the UV light at a dose of at least 500 milli-watts per cm squared.

75. The method, as in claim 66, wherein the UV applying step is further comprised of the step of:
   applying the UV light at a dose of at least 500 milli-watts per cm squared.

76. The method, as in claim 66, wherein the method is further comprised of the step of:
   depositing a high etch selectivity material substantially over the resist.

77. The method, as in claim 76, wherein the material is further comprised of:
   chromium (chrome).

78. The method, as in claim 76, wherein the deposition step is further comprised of the step of:
   removing substantially all of the high etch selectivity material except that material that is in substantially direct contact with the film.

79. The method, as in claim 66, wherein the method is further comprised of the step of:
   etching the optical film by using an RIE etch.

80. The method, as in claim 78, wherein the method is further comprised of the step of:
   etching the optical film by using an RIE etch.

* * * * *

UNITED STATES PATENT AND TRADEMARK OFFICE
CERTIFICATE OF CORRECTION

| | |
|---|---|
| PATENT NO. | : 7,277,619 B2 |
| APPLICATION NO. | : 11/072657 |
| DATED | : October 2, 2007 |
| INVENTOR(S) | : James E. Ellenson et al. |

It is certified that error appears in the above-identified patent and that said Letters Patent is hereby corrected as shown below:

In column 3, line 33, delete "Wavequide" and insert -- Waveguide --, therefor.

In column 4, line 16, delete "A" and insert -- $\Lambda$ --, therefor.

In column 7, line 57, in Claim 4, after "as" insert -- in --.

In column 8, line 27, in Claim 12, delete "mm" and insert -- nm --, therefor.

In column 9, line 11, in Claim 25, after "as" insert -- in --.

In column 9, line 14, in Claim 26, after "as" insert -- in --.

In column 9, line 30, in Claim 29, after "as" insert -- in --.

In column 9, line 41, in Claim 32, after "waveguide," insert -- $\lambda$ --.

In column 9, line 43, in Claim 32, delete "(~4)" and insert -- (~1) --, therefor.

In column 10, line 29, in Claim 44, after "as" insert -- in --.

In column 10, line 54, in Claim 49, delete "um" and insert -- nm --, therefor.

In column 11, line 52, in Claim 65, after "as" insert -- in --.

In column 11, line 55, in Claim 66, after "as" insert -- in --.

In column 12, line 13, in Claim 69, after "as" insert -- in --.

UNITED STATES PATENT AND TRADEMARK OFFICE
CERTIFICATE OF CORRECTION

PATENT NO. : 7,277,619 B2
APPLICATION NO. : 11/072657
DATED : October 2, 2007
INVENTOR(S) : James E. Ellenson et al.

It is certified that error appears in the above-identified patent and that said Letters Patent is hereby corrected as shown below:

In column 12, line 26, in Claim 72, delete "$h_{air}$" and insert -- $n_{air}$ --, therefor.

Signed and Sealed this

Eleventh Day of November, 2008

JON W. DUDAS
*Director of the United States Patent and Trademark Office*